(12) United States Patent
Zhang et al.

(10) Patent No.: US 11,508,775 B2
(45) Date of Patent: **\*Nov. 22, 2022**

(54) THREE-DIMENSIONAL IMAGE SENSOR BASED ON STRUCTURED LIGHT

(71) Applicant: Samsung Electronics Co., Ltd., Suwon-si (KR)

(72) Inventors: Gang Zhang, Suwon-si (KR); Shi Li Quan, Suwon-si (KR); Hyung-yong Kim, Cheongju-si (KR); Seug-gab Park, Suwon-si (KR); In-gyu Baek, Seoul (KR); Kyung-rae Byun, Suwon-si (KR); Jin-yong Choi, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/398,493

(22) Filed: Aug. 10, 2021

(65) Prior Publication Data

US 2021/0366974 A1 Nov. 25, 2021

Related U.S. Application Data

(63) Continuation of application No. 16/410,386, filed on May 13, 2019, now Pat. No. 11,183,527.

(30) Foreign Application Priority Data

Oct. 18, 2018 (KR) ........................ 10-2018-0124583

(51) Int. Cl.
*H01L 27/146* (2006.01)
*H04N 5/335* (2011.01)

(52) U.S. Cl.
CPC .. *H01L 27/14636* (2013.01); *H01L 27/14627* (2013.01); *H04N 5/335* (2013.01)

(58) Field of Classification Search
CPC ......... H01L 27/14636; H01L 27/14609; H01L 27/1464; H01L 27/14634; H01L 27/14612;
(Continued)

(56) References Cited

U.S. PATENT DOCUMENTS 8,743,252 B2 6/2014 Watanabe
9,142,689 B2 9/2015 Kondo
(Continued)

OTHER PUBLICATIONS

Non-Final Office Action dated Aug. 18, 2020 in U.S. Appl. No. 16/410,386.
(Continued)

*Primary Examiner* — Samuel Park
(74) *Attorney, Agent, or Firm* — Harness, Dickey & Pierce, P.L.C.

(57) ABSTRACT

The inventive concepts provide a three-dimensional (3D) image sensor, based on structured light (SL), having a structure in which difficulty in a manufacturing process of a wiring layer is decreased and/or an area of a bottom pad of a capacitor is increased. The 3D image sensor includes: a pixel area including a photodiode in a semiconductor substrate and a gate group including a plurality of gates; a multiple wiring layer on an upper portion of the pixel area, the multiple wiring layer including at least two wiring layers; and a capacitor structure between a first wiring layer on a lowermost wiring layer of the multiple wiring layer and a second wiring layer on the first wiring layer, the capacitor structure including a bottom pad, a top pad, and a plurality of capacitors, wherein the bottom pad is connected to the first wiring layer.

20 Claims, 11 Drawing Sheets

(58) Field of Classification Search
CPC ......... H01L 27/14603; H01L 27/14621; H01L 27/14627; H01L 27/14643; H01L 28/91; H01L 27/1463; H01L 27/14641; H01L 27/14689; H01L 27/14645; H01L 23/5223; H01L 27/10814; H01L 27/1461; H01L 27/10852; H01L 28/40
See application file for complete search history.

(56) References Cited

U.S. PATENT DOCUMENTS

| | | |
|---|---|---|
| 9,917,119 B2 | 3/2018 | Murakami et al. |
| 2009/0201400 A1 | 8/2009 | Zhang et al. |
| 2012/0061789 A1 | 3/2012 | Yang et al. |
| 2013/0127012 A1 | 5/2013 | Koo |
| 2014/0218578 A1 | 8/2014 | Kohyama |
| 2015/0155328 A1 | 6/2015 | Park et al. |
| 2016/0191833 A1 | 6/2016 | Higashi et al. |
| 2017/0170224 A1 | 6/2017 | Huang et al. |
| 2018/0331140 A1* | 11/2018 | Sato ................ H04N 5/37452 |
| 2020/0035628 A1 | 1/2020 | Huang et al. |

OTHER PUBLICATIONS

Final Office Action dated Feb. 17, 2021 in U.S. Appl. No. 16/410,386.
Notice of Allowance dated Apr. 30, 2021 in U.S. Appl. No. 16/410,386.

* cited by examiner

THREE-DIMENSIONAL IMAGE SENSOR BASED ON STRUCTURED LIGHT

CROSS-REFERENCE TO RELATED APPLICATIONS

This application is a Continuation of U.S. application Ser. No. 16/410,386, filed on May 13, 2019, which claims the benefit of Korean Patent Application No. 10-2018-0124583, filed on Oct. 18, 2018, in the Korean Intellectual Property Office, the disclosure of each of which is incorporated herein in its entirety by reference.

BACKGROUND

The inventive concepts relate to a three-dimensional (3D) image sensor, and more particularly, to a 3D image sensor based on structured light (SL).

In connection with a method of realizing a target object or a measurement object in a 3D image, there is a passive method that uses natural light without a separate light source and an active method that uses an active light source. In a stereo vision system, which is one of the passive methods, a disparity occurs due to a distance between two sensors which capture two or more images, and 3D depth information is calculated by using the disparity. On the other hand, in the case of an SL method, which is one of the active methods, after a laser beam of a specific pattern is irradiated to a target object, depth information is calculated by analyzing a degree of deformation of a specific pattern according to a surface shape of the target object.

SUMMARY

The inventive concepts provide a three-dimensional (3D) image sensor, based on structured light (SL), having a structure in which the difficulty in a manufacturing process of a wiring layer may be decreased and/or an area of a bottom pad of a capacitor may be increased.

According to an aspect of the inventive concepts, there is provided a three-dimensional (3D) image sensor based on structured light (SL), the 3D image sensor including: a pixel area including a photodiode in a semiconductor substrate, the pixel area including a gate group including a plurality of gates on a top portion of and around the photodiode; a multiple wiring layer on an upper portion of the pixel area, the multiple wiring layer including at least two wiring layers electrically connected to the semiconductor substrate and at least one of the plurality of gates; and a capacitor structure between a first wiring layer on a lowermost wiring layer of the multiple wiring layer and a second wiring layer on the first wiring layer, the capacitor structure including a bottom pad, a top pad, and a plurality of capacitors between the bottom pad and the top pad, wherein the bottom pad is connected to the first wiring layer.

According to another aspect of the inventive concepts, there is provided a three-dimensional (3D) image sensor based on structured light (SL), the 3D image sensor including: a charge generation area at a central portion of a pixel on a semiconductor substrate; a gate group including a plurality of gates configured to transmit charges generated in the charge generation area; a multiple wiring layer including at least two wiring layers on the pixel and electrically connected to the semiconductor substrate and at least one of the plurality of gates; and a capacitor structure between two adjacent wiring layers of the multiple wiring layer, the capacitor structure including a bottom pad, a top pad, and a plurality of capacitors between the bottom pad and the top pad, wherein there is no wiring layer at a level where the bottom pad is arranged.

According to another aspect of the inventive concepts, there is provided a three-dimensional (3D) image sensor based on structured light (SL), the 3D image sensor including: a pixel area including a photodiode in a semiconductor substrate, the pixel area including a gate group including a plurality of gates on a top portion of and around the photodiode; a multiple wiring layer on an upper portion of the pixel area, the multiple wiring layer including at least two wiring layers electrically connected to the semiconductor substrate and at least one of the plurality of gates; and a capacitor structure between a first wiring layer on a lowermost wiring layer of the multiple wiring layer and a second wiring layer on the first wiring layer, the capacitor structure including a bottom pad, a top pad, and a plurality of capacitors between the bottom pad and the top pad, wherein, corresponding to the pixel area, at least two of the bottom pads are apart from each other, and the bottom pad is connected to the first wiring layer.

BRIEF DESCRIPTION OF THE DRAWINGS

Embodiments of the inventive concepts will be more clearly understood from the following detailed description taken in conjunction with the accompanying drawings in which.

DETAILED DESCRIPTION OF SOME EMBODIMENTS

Figure 1A:
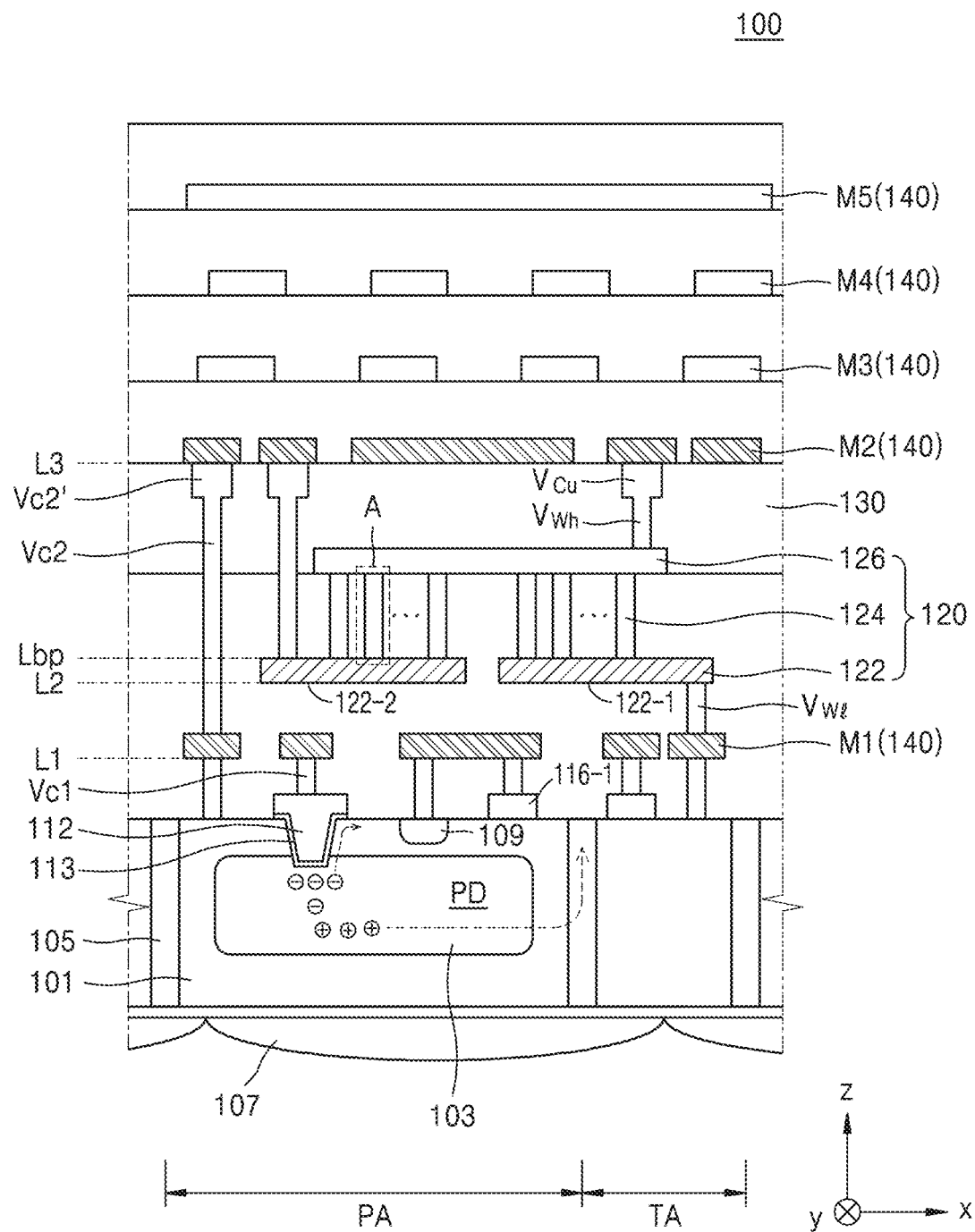
FIG. 1A is a cross-sectional view of a three-dimensional (3D) image sensor based on structured light (SL) according to some embodiments.

Hereinafter, embodiments of the present inventive concepts will be described in detail with reference to the accompanying drawings. Identical reference numerals are used for the same constituent elements in the drawings, and duplicate descriptions thereof are omitted.

Figure 1B:
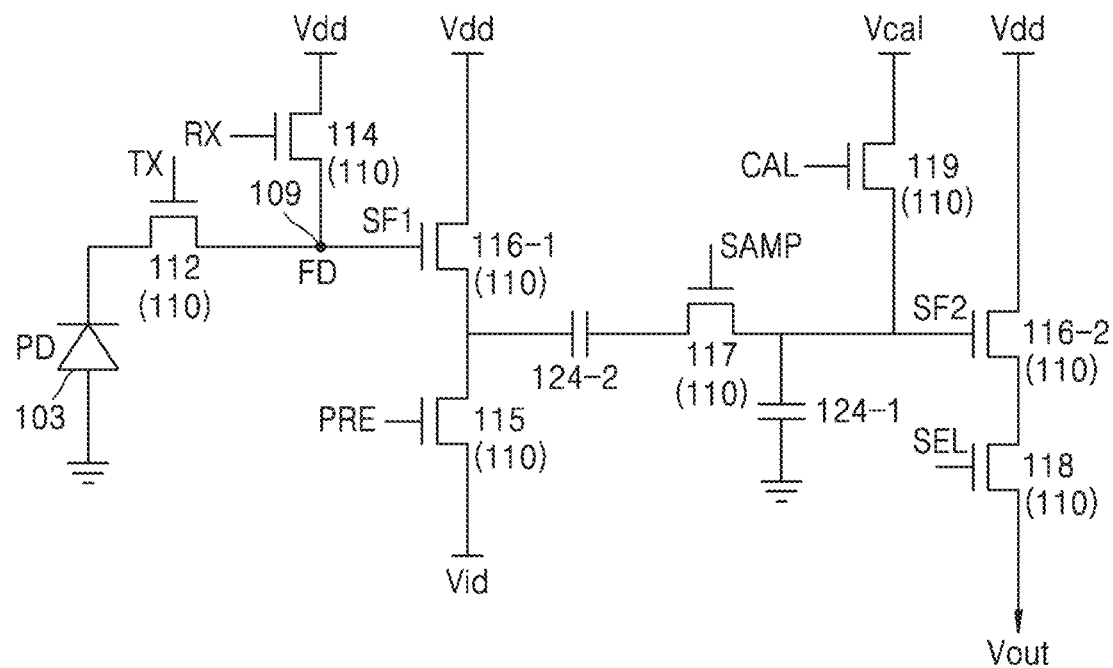
FIGS. 1B and 1C are equivalent circuit diagrams corresponding to the 3D image sensor of FIG. 1A.
Figure 1C:
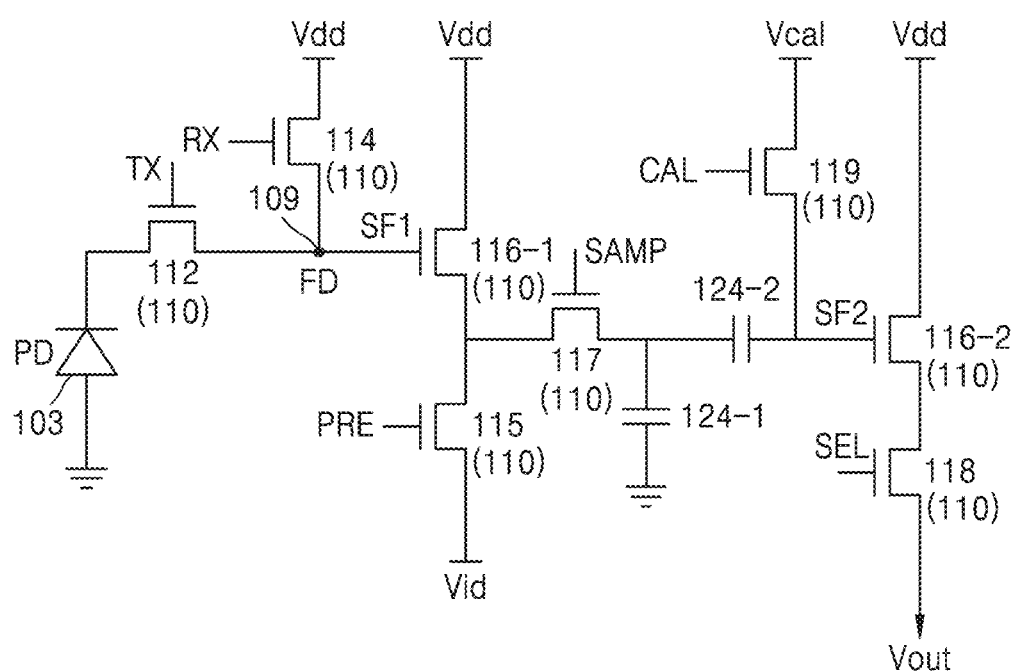
Figure 1D:
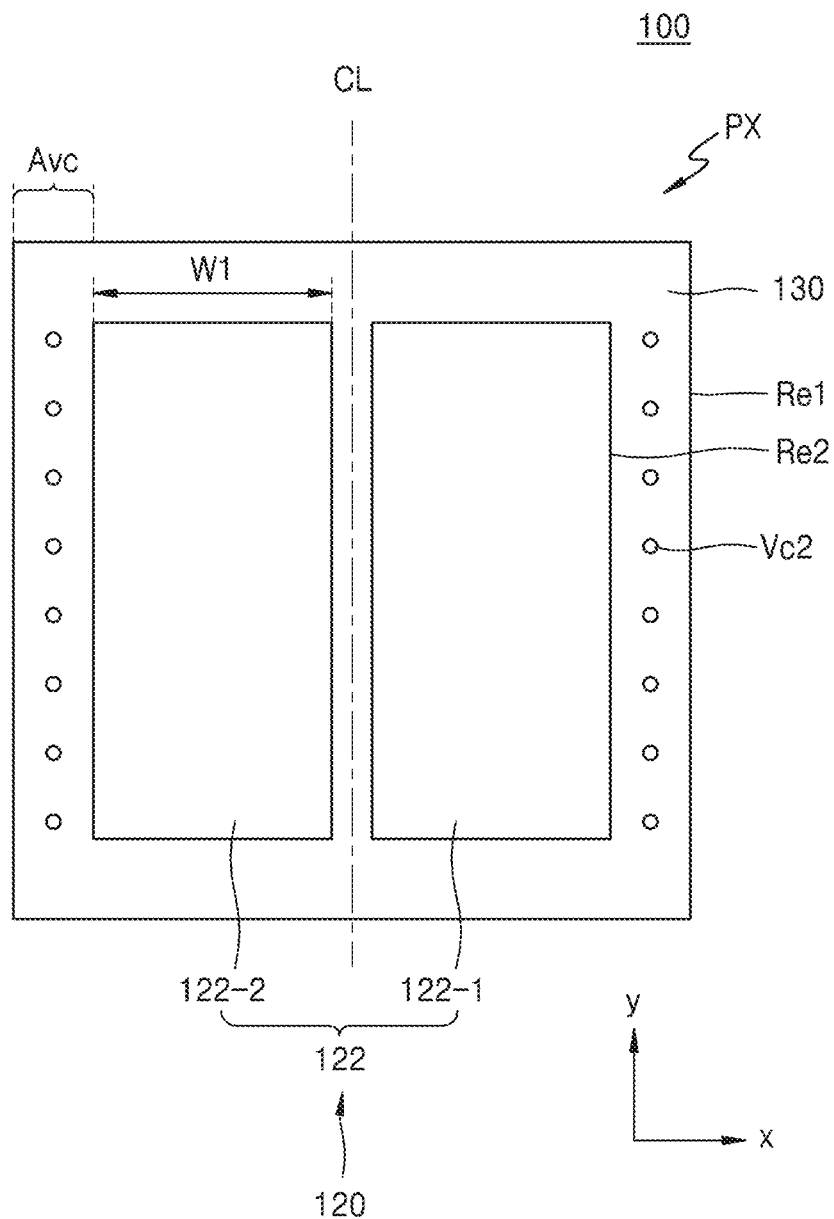
FIG. 1D is a plan view of the 3D image sensor of FIG. 1A on a level of a top surface of a bottom pad.

FIG. 1A is a cross-sectional view of a three-dimensional (3D) image sensor based on structured light (SL) 100 according to some embodiments, FIGS. 1B and 1C are equivalent circuit diagrams corresponding to a 3D image sensor 100 of FIG. 1A, and FIG. 1D is a plan view of the 3D image sensor 100 of FIG. 1A at a level of a top surface of a bottom pad.

Referring to FIGS. 1A through 1D, the 3D image sensor 100 based on the SL 100 (hereinafter, referred to as a "3D image sensor") according to some embodiments may include a semiconductor substrate 101, a photodiode (PD) 103, a gate group 110, a capacitor structure 120, an interlayer insulating layer 130, and/or a multi-layer wiring layer 140.

The semiconductor substrate 101 may include, for example, a p-type semiconductor substrate. However, the semiconductor substrate 101 is not limited thereto. A plurality of pixels may be in a two-dimensional array structure on the semiconductor substrate 101, and each pixel may include a PD area (PA) and a transistor (TR) area (TA). A p-type well area may be formed in a top area of the semiconductor substrate 101. The gate group 110 may be on the p-type well area to configure various TRs. A microlens 107 may be on a bottom surface of the semiconductor substrate 101. Light may be incident on the bottom surface of the semiconductor substrate 101 through the microlens 107. Accordingly, the 3D image sensor 100 of some embodiments may have a back side illumination (BSI) structure. According to some embodiments, a color filter may be between the semiconductor substrate 101 and microlenses 107.

The PD 103 may be formed in the semiconductor substrate 101. The PD 103 may include an n-type doped area and a p-type doped area. The PD 103 may be in the PA of the pixel. On the other hand, a plurality of TRs for transferring charges may be on a top portion of the PD 103 of the PA and in the TA adjacent to the PA. As illustrated in FIG. 1A, the PA and the TA may be separated by an isolation structure 105. The isolation structure 105 may include, for example, a deep trench isolation (DTI) structure. However, the isolation structure 105 is not limited thereto. For example, according to some embodiments, the isolation structure 105 may include a shallow trench isolation (STI) structure. In addition, according to some embodiments, the isolation structure 105 may be omitted between the PA and the TA. On the other hand, according to the embodiment, a metal shield layer may be formed on the bottom surface of the semiconductor substrate 101 corresponding to the TA to block incidence of light into the TA.

For reference, the 3D image sensor 100 of some embodiments may use the SL of a light irradiator (refer to 200 in FIG. 6) and may employ a global shutter scheme. The SL may denote light in the form of a one-dimensional or two-dimensional lattice. The global shutter scheme may be a concept in which all pixels are simultaneously reset and light signals are accumulated, and may be a concept opposite to a rolling shutter scheme in which an operation of pixels is controlled in units of rows.

The 3D image sensor 100 according to some embodiments may include, as a charge storage structure for storing charges that are generated by receiving the SL reflected from the target object, the capacitor structure 120 to be described below.

The gate group 110 may include a transfer gate 112, a reset gate 114, a first follower gate 116-1, a second source follower gate 116-2, a precharge gate 115, a sampling gate 117, a calibration gate 119, and/or a selection gate 118. The transfer gate 112, the reset gate 114, the first and second source follower gates 116-1 and 116-2, the precharge gate 115, the sampling gate 117, the calibration gate 119, and/or the selection gate 118 may constitute a transfer TR TX, a reset TR RX, a first source follower TR SF1, a second source follower TR SF2, a precharge TR PRE, a sampling TR SAMP, a calibration TR CAL, and a selection TR SEL, respectively. It may be understood from the equivalent circuit diagram of FIG. 1B that a floating diffusion (FD) area 109 is between the transfer gate 112 and the reset gate 114, and electrically connected to the first source follower gate 116-1. While only the transfer gate 112, the FD area 109, and the first source follower gate 116-1 are illustrated in the PA in FIG. 1A, the other gates may be at different locations of the PA in a second direction (y direction) or may be in the TA. In addition, in FIG. 1A, only one gate is illustrated in the TA, but a plurality of gates may be in the second direction (y direction). Referring to the equivalent circuit diagram of FIG. 1B, an operation of the 3D image sensor 100 of some embodiments is briefly described.

First, the transfer TR TX and the reset TR RX may be turned on, and thus, the PDs 103 of all the pixels may be reset. Next, the transfer TR TX and the reset TR RX may be turned off, and charge accumulation of all the pixels may start. Thereafter, the reset TR RX may be turned on, the FD area 109 may be reset, and at the same time, the calibration TR CAL may be turned on to reset a first capacitor 124-1. In addition, when the sampling TR SAMP is turned on and a voltage at the other end of a second capacitor 124-2 is reset due to a calibration voltage Vcal, at the same time, the sampling TR SAMP may start a sample hold for the voltage at the other end of the second capacitor 124-2. Next, the reset TR RX may be turned off and thus the reset of the FD area 109 may be terminated, and the calibration TR CAL may be turned off and thus the reset of the first capacitor 124-1 may be terminated. At this point, the second capacitor 124-2 may lock a first voltage (a voltage after the reset of the FD area 109) corresponding to an amplification signal output from the first source follower TR 116-1. Thereafter, the transfer TR TX may be turned on and charges stored in the PD 103 may be transferred to the FD area 109 via the transfer TR TX and stored in the FD area 109. Next, the transfer TR TX may be turned off and then the sampling TR SAMP may be turned off. Thus, the sample hold of the voltage at the other end of the second capacitor 124-2 may be terminated. At this point, the second capacitor 124-2 may hold a second voltage (a voltage after the charge accumulation of the FD area 109) corresponding to the amplification signal output from the first source follower TR 116-1. Thereafter, the reset TR RX may be turned on and the selection TR SEL may be turned on, and thus, a voltage Vout corresponding to the charge stored in the first capacitor 124-1 may be output.

A charge corresponding to a voltage change due to charges generated in the PD 103 due to an operation of the second capacitor 124-2 and the sampling TR SAMP may be accumulated in the first capacitor 124-1. In addition, due to the operation, reset noise caused by an operation of the reset TR RX, noise due to a circuit threshold deviation of the first source follower TR SF1, etc. may be removed. The operation of the second capacitor 124-2 and the sampling TR SAMP may correspond to a correlated double sampling (CDS) operation.

In the case of the equivalent circuit of FIG. 1C, the second capacitor 124-2 may be between the calibration TR CAL and the first capacitor 124-1, which is not significantly different from the equivalent circuit of FIG. 1B in the overall operation. However, by increasing the capacitance of the second capacitor 124-2, the noise generated when the calibration TR CAL is turned off may be reduced.

In addition, according to some embodiments, in the equivalent circuit of FIG. 1B, the calibration TR CAL may be between the sampling TR SAMP and the second capacitor 124-2 rather than the first capacitor 124-1. Further, according to some embodiments, the second capacitor 124-2 and/or the calibration TR CAL may be omitted. When the second capacitor 124-2 is omitted, a second bottom pad 122-2 in the capacitor structure 120 in FIG. 1A may be omitted. Further, according to some embodiments, three or more capacitors may be included in pixel area, in that case three or more bottom pads may be arranged.

The transfer gate 112 may have a recess structure. The transfer gate 112 may be formed such that a top portion of the semiconductor substrate 101 is recessed to a certain depth, and the recessed top portion is filled with polysilicon. As illustrated in FIG. 1A, a bottom surface of the transfer gate 112 may extend to the top portion of the PD 103. The transfer gate 112 having such a recessed structure may be referred to as a vertical transfer gate. A gate oxide layer 113 may be between the transfer gate 112 and the semiconductor substrate 101.

When a voltage is applied to the transfer gate 112, as illustrated in FIG. 1A, charges generated by the PD 103, for example, electrons, may be transferred to the FD area 109 through a channel formed on the bottom surface of the transfer gate 112. On the other hand, holes in the charges generated in the PD 103 may be discharged to the outside via the isolation structure 105. Accordingly, inside the isolation structure 105, a conductive material may be placed, and a negative (−) or ground voltage may be applied to the conductive material.

On the other hand, the gates (114, 115, 116-1, 116-2, 117, 118, and 119) other than the transfer gate 112 may have a horizontal structure including polysilicon on the semiconductor substrate 101. According to some embodiments, the gates (112, 114, 115, 116-1, 116-2, 117, 118, and 119) may include metal.

The interlayer insulating layer 130 and the multiple wiring layer 140 may be over the semiconductor substrate 101 and the gate group 110. In addition, the capacitor structure 120 may be in the interlayer insulating layer 130 between two adjacent wiring layers among multiple wiring layers.

The multiple wiring layer 140 including a plurality of wiring layers may be in the interlayer insulating layer 130 over the semiconductor substrate 101 and the gate group 110. For example, the multiple wiring layer 140 may include first through fifth wiring layers M1 through M5.

The first wiring layer M1, as a lowermost wiring layer among the plurality of wiring layers of the multiple wiring layer 140, may be adjacent to the semiconductor substrate 101. The first wiring layer M1 may include a plurality of wirings and/or pads and may be at a first level L1 in a vertical direction of the semiconductor substrate 101, that is, a third direction (z direction). The pads of the first wiring layer M1 may be connected to conductive materials of the semiconductor substrate 101, the gates (112, 114, 115, 116-1, 116-2, 117, 118, and 119), and the isolation structure 105 via first vertical contacts Vc1. On the other hand, as illustrated in FIG. 1A, one of the pads of the first wiring layer M1 may be connected downward to the semiconductor substrate 101 and may be connected upward to the bottom pad 122 of the capacitor structure 120.

The second wiring layer M2 may be over the first wiring layer M1 and may also include a plurality of wirings and/or pads. The second wiring layer M2 may be connected to the first wiring layer M1 via a second vertical contact Vc2 and an additional second vertical contact Vc2'. As illustrated in FIG. 1A, the additional second vertical contact Vc2' may be on the second vertical contact Vc2. The additional second vertical contact Vc2' may be formed by a damascene process. However, according to some embodiments, the additional second vertical contact Vc2' may be omitted.

The third through fifth wiring layers M3 through M5 may be over the second wiring layer M2 and may be connected to other wiring layers at other levels via corresponding vertical contacts. On the other hand, the fifth wiring layer M5 may include a shield plate formed on the uppermost portion thereof for blocking noise from the outside. According to some embodiments, at least one of the fourth wiring layer M4 and the fifth wiring layer M5 may be omitted.

The first wiring layer M1, the first vertical contact Vc1, and the second vertical contact Vc2 may include tungsten (W), and the additional second vertical contact Vc2' and the second through fifth wiring layers M2 through M5 may include copper (Cu). However, materials of the first through fifth wiring layers M1 through M5, the first vertical contact Vc1, the second vertical contact Vc2, and the additional second vertical contact Vc2' are not limited thereto. At least one barrier metal layer may be on boundaries between the first through fifth wiring layers M1 through M5, the first vertical contact Vc1, the second vertical contact Vc2, and the additional second vertical contact Vc2', and the interlayer insulating layer 130.

The capacitor structure 120 may be between the first wiring layer M1 and the second wiring layer M2 of the multiple wiring layer 140. The capacitor structure 120 may include the bottom pad 122, a top pad 126, and/or a capacitor 124. Two bottom pads 122 may correspond to one pixel PX. By arranging two bottom pads 122 in one capacitor structure 120, the capacitor structure 120 may function as two capacitors. For example, the bottom pad 122 may include a first bottom pad 122-1 and the second bottom pad 122-2, and the first bottom pad 122-1 and the second bottom pad 122-2 may correspond to the first and second capacitors 124-1 and 124-2 illustrated in FIG. 1B or FIG. 1C, respectively. As described above, the CDS may be performed by using the second capacitor 124-2 and the sampling TR SAMP.

The first bottom pad 122-1 may be connected to a corresponding pad of the first wiring layer M1 via a bottom vertical contact $V_{W_7}$, and the second bottom pad 122-2 may be connected to a corresponding pad of the second wiring layer M2 via the second vertical contact Vc2 and the additional second vertical contact Vc2'. The second vertical contact Vc2 connected to the second bottom pad 122-2 may be shorter than the second vertical contact Vc2 connected to the pad of the first wiring layer M1. The top pad 126 may be connected to a corresponding pad of the second wiring layer M2 via a top vertical contact $V_{W_h}$ and an additional top vertical contact $V_{Cu}$. The bottom pad 122, the bottom vertical contact $V_{W_7}$, and the top vertical contact $V_{W_h}$ may include, for example, W. The additional top vertical contact $V_{Cu}$ may be formed by a damascene process, like the additional second vertical contact Vc2', may include Cu, and may be omitted according to an embodiment. However, materials of the bottom pad 122, the bottom vertical contact $W_{W_7}$, the top vertical contact $V_{W_h}$, and the additional top vertical contact $V_{Cu}$ are not limited thereto.

As illustrated in FIG. 1D, when a horizontal cross-section of the pixel PX has a structure of a first rectangle Re1, the bottom pad 122 may be wide at the center portion of the first rectangle Re1. For example, each of the first and second bottom pads 122-1 and 122-2 may have a structure of a second rectangle Re2 extending in the second direction (y direction). The first and second bottom pads 122-1 and 122-2 may be adjacent to each other in the central portion of the first rectangle Re1 while being symmetrical with respect to a center line CL passing through the center of the first rectangle Re1.

Each of the first and second bottom pads 122-1 and 122-2 may have a first width W1 in a first direction (x direction). The first width W1 may be less than about ½ of a width of the first rectangle Re1 in the first direction (x direction). Accordingly, a vertical contact area Avc may be allocated to an outer portion of the first rectangle Re1 outside the bottom pad 122. A plurality of second vertical contacts Vc2 may be in the vertical contact area Avc. For reference, FIG. 1D is a plan view of the pixel PX viewed from a top level Lbp of the bottom pad 122, and accordingly, the second vertical contacts Vc2 are illustrated as being cut horizontally at the top level Lbp. Even though the vertical contact area Avc is allocated to both outer portions of the first rectangle Re1 in the first direction (x direction), the allocation position of the vertical contact area Avc is not limited thereto. For example, the vertical contact area Avc may be additionally allocated to both outer portions of the first rectangle Re1 in the second direction (y direction), and the second vertical contacts Vc2 may be in the additionally allocated vertical contact area Avc in the first direction (x direction).

A plurality of capacitors 124 may be between the bottom pad 122 and the top pad 126. The top pad 126 may be on the capacitors 124 as a structure covering all the capacitors 124 and may be formed in one body unlike the bottom pad 122. The descriptions of the capacitor structure 120 are given with reference to FIG. 2 in more detail.

In the 3D image sensor 100 of some embodiments, the first wiring layer M1 may be at the first level L1 in a vertical direction with respect to the semiconductor substrate 101, that is, in the third direction (z direction), and the second wiring layer M2 may be at the third level L3 in the third direction (z direction). The bottom pad 122 may be at a second level L2 between the first level L1 and the third level L3 in the third direction (z direction). Since the bottom pad 122 is between the first level L1 and the third level L3, there may be some of the following advantages. First, the pads of the second wiring layer M2 and the bottom pad 122 may be easily formed. Second, a short failure between the pads of the second wiring layer M2 and the bottom pad 122 may be reduced. Third, when a pixel size is decreased in the future, securing an area of the bottom pad 122 may be easier.

For reference, in a conventional 3D image sensor, a bottom pad may be at the same level as the pads of the second wiring layer M2. For example, in the conventional 3D image sensor, first pads of a small size and bottom pads of a large size may be formed together in the second wiring layer M2. Thus, in the case of the conventional 3D image sensor, a degree of difficulty in a process of forming the second wiring layer M2 may be increased, and accordingly, a process time may be increased. To form a pattern, generally, first, a mask corresponding to a corresponding pattern may be manufactured through an optical proximity correction (OPC) operation, and then a photolithography process may be performed by using the mask to form a photoresist pattern. Thereafter, an etch process for the pattern may be performed by using the photoresist pattern. However, when the first pads and the bottom pads having different sizes and shapes coexist in the second wiring layer M2, the OPC process, the photolithography process, and the etch process may become complicated, the number of processes may increase, and a degree of completeness may be significantly reduced. In addition, due to a lack of space in the second wiring layer M2 and a low completeness of pattern formation, the short failure between the first pads and the bottom pad may increase.

In general, the bottom pads may be at the central portion of the pixel PX and the first pads may be in the outer portion of the pixel PX. For example, in FIG. 1D, the first pads may be in the outer portion of the first rectangle Re1 outside the bottom pad 122. On the other hand, the bottom pad may be required to secure some area for securing capacity of the capacitors. Thus, in the conventional 3D image sensor structure in which the first pads and the bottom pad are formed together in the second wiring layer M2, when the pixel size is reduced, it may be difficult to secure a sufficient area of the bottom pad.

On the other hand, in the 3D image sensor 100 of some embodiments, by arranging the bottom pad 122 at a level between the first wiring layer M1 and the second wiring layer M2, one or more of the problems described above may be solved. In other words, the pads of the second wiring layer M2 and the bottom pad 122 may be easily formed, the short failures between the pads of the second wiring layer M2 and the bottom pad 122 may be reduced, and/or even if the pixel size decreases in the future, the area of the bottom pad 122 may be sufficiently secured.

Figure 2:
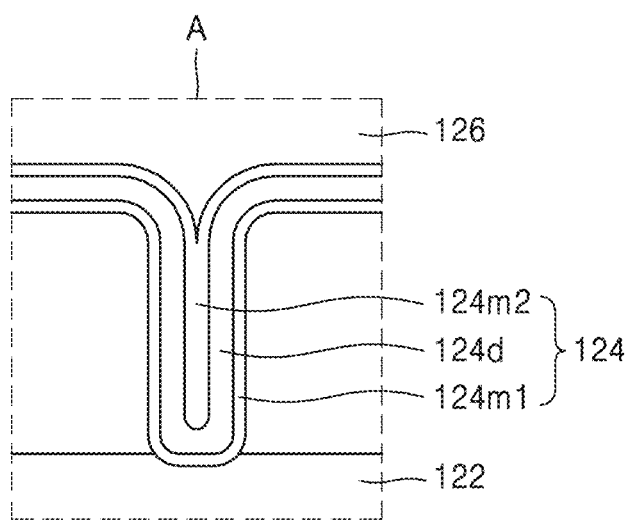
FIG. 2 is an enlarged view illustrating a region A of a capacitor structure of the 3D image sensor of FIG. 1A.

FIG. 2 is an enlarged view illustrating a region A of the capacitor structure 120 of the 3D image sensor 100 of FIG. 1A.

Referring to FIG. 2, in the 3D image sensor 100 of some embodiments, the capacitor structure 120 may include the bottom pad 122 on a bottom portion thereof, the top pad 126 on a top portion thereof, and/or a plurality of capacitors 124 between the bottom pad 122 and the top pad 126.

The bottom pad 122 may be connected to the pad of the first wiring layer M1 via a bottom vertical contact (refer to $W_{W1}$ in FIG. 1A), and accordingly, may be connected to the semiconductor substrate 101. For example, the first bottom pad 122-1 may be connected to a source area of the sampling TR SAMP via the pad of the first wiring layer M1. Accordingly, the first capacitor (refer to 124-1 in FIG. 1B or FIG. 1C) including the first bottom pad 122-1 may store charges corresponding to a voltage fixed to the second capacitor 124-2.

The capacitor 124 may have a cylindrical structure, and may include a first metal layer 124$m$1, a dielectric layer 124$d$, and/or a second metal layer 124$m$2. In some embodiments, the cylindrical structure may refer to only portions of the first metal layer 124$m$1, the dielectric layer 124$d$, and the second metal layer 124$m$2, which are formed perpendicular to a top surface of the bottom pad 122. The first metal layer 124$m$1 and the second metal layer 124$m$2 may include, for example, titanium nitride (TiN). However, the material of the first metal layer 124$m$1 and the second metal layer 124$m$2 is not limited thereto.

On the other hand, the dielectric layer 124$d$ may include a high-dielectric (high-k) material having a dielectric constant of about 10 to about 25. For example, the dielectric layer 124$d$ may include metal oxides such as hafnium oxide ($HfO_2$), zirconium oxide ($ZrO_2$), titanium oxide ($TiO_2$), and aluminum oxide ($Al_2O_3$), silicates thereof or aluminates thereof. In addition, the dielectric layer 124$d$ may include metal nitride oxide such as aluminum oxynitride (AlON), zirconium oxynitride (ZrON), hafnium oxynitride (HfON), lanthanum oxynitride (LaON), and yttrium oxynitride (YON), silicates thereof, or aluminates thereof.

The top pad 126 may be formed as a structure covering all of the plurality of capacitors 124, and may include, for example, silicon germanium (SiGe). However, the material of the top pad 126 is not limited thereto.

The capacitor structure 120 may be formed by the following process. First, the bottom pad 122 may be formed at the second level L2 over the semiconductor substrate 101. Next, the interlayer insulating layer 130 covering the bottom pad 122 may be formed and planarized, and then trenches may be formed in the portions where the capacitor structures 120 are to be formed. The bottom pad 122 may be exposed at a bottom surface of the trench. Thereafter, material layers for the first metal layer 124m1, the dielectric layer 124d, and the second metal layer 124m2 may be formed in order, and a material layer of the top pad 126, for example, a SiGe layer, may be formed on the material layer of the second metal layer 124m2. Finally, the capacitor structure 120 may be completed by forming the first metal layer 124m1, the dielectric layer 124d, and the second metal layer 124m2, and the top pad 126 by a patterning process.

Thereafter, the top vertical contact $V_{Wh}$ and the additional top vertical contact $V_{Cu}$ may be formed on the capacitor structure 120, and the top pad 126 may be electrically connected to the corresponding pad of the second wiring layer M2 via the top vertical contact $V_{Wh}$ and the additional top vertical contact $V_{Cu}$.

Figure 3A:
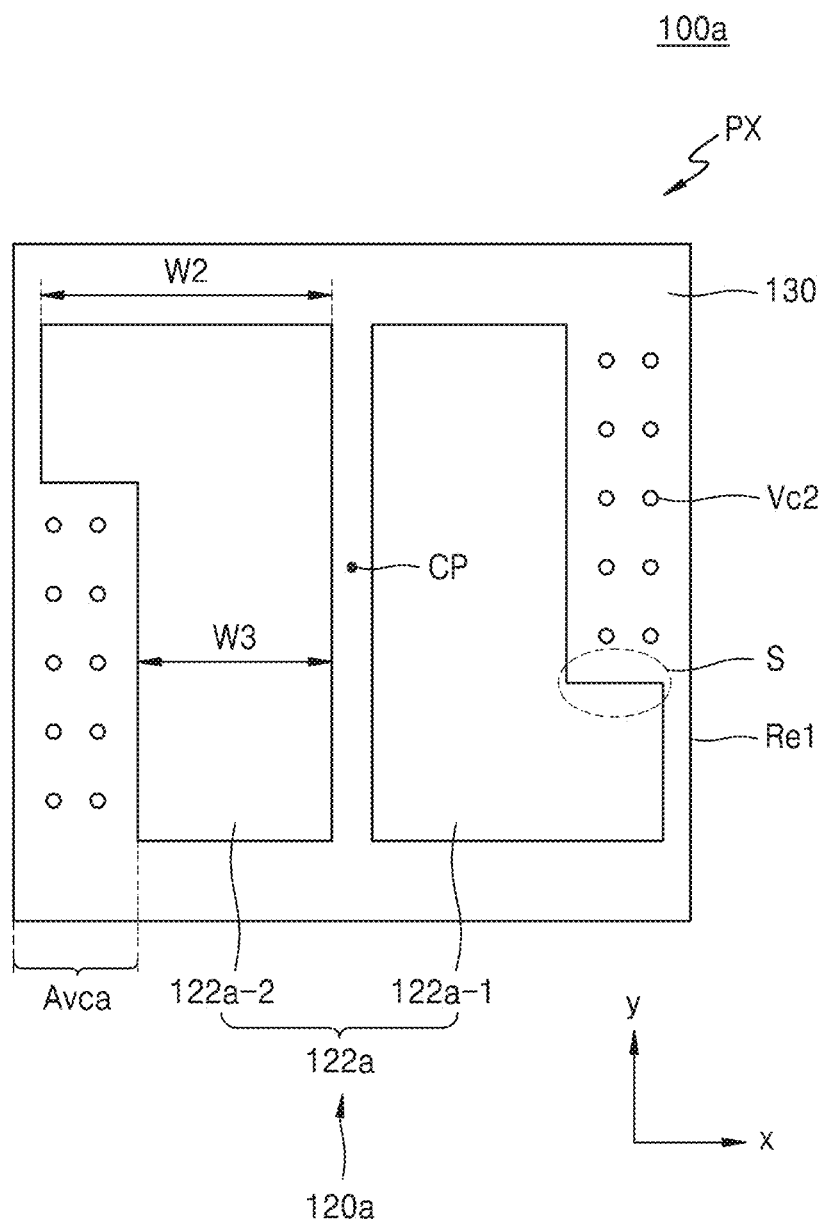
FIGS. 3A through 3C are plan views on the level of top surfaces of bottom pads of 3D image sensors based on the SL according to some embodiments, respectively, which correspond to FIG. 1D.
Figure 3B:
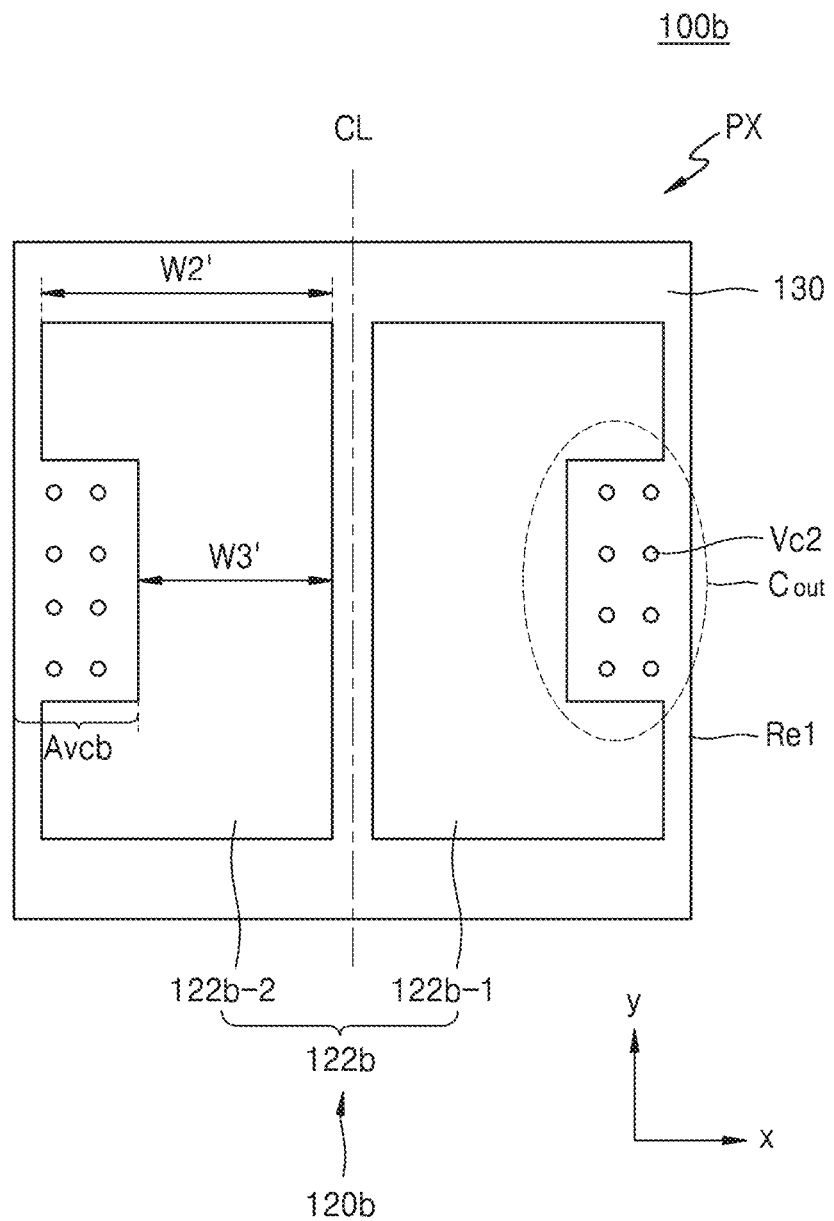
Figure 3C:
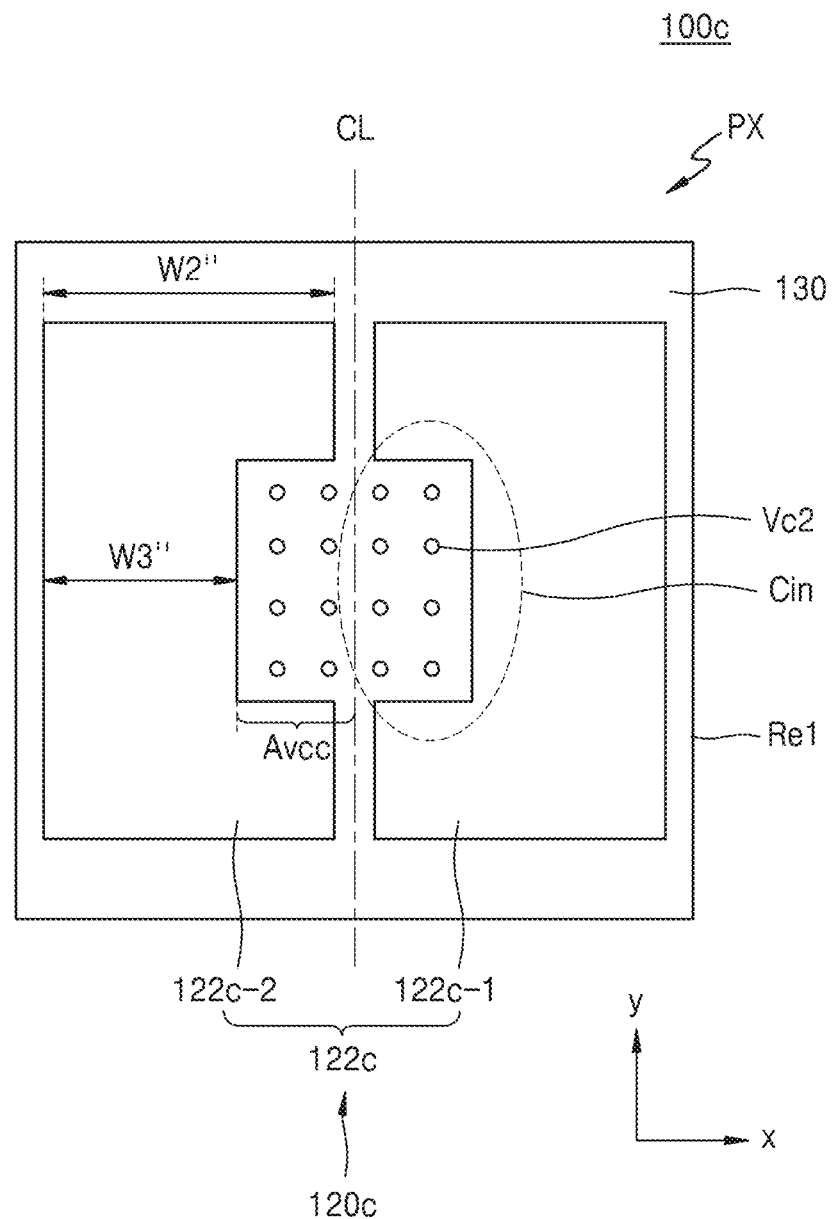

FIGS. 3A through 3C are plan views at the level of the top surfaces of bottom pads 122a, 122b, and 122c of 3D image sensors 100a, 100b, and 100c based on the SL according to some embodiments, respectively, which correspond to FIG. 1D. The descriptions already given with reference to FIGS. 1A through 2 are briefly provided or omitted.

Referring to FIG. 3A, the 3D image sensor 100a according to some embodiments may be different from the 3D image sensor 100 illustrated in FIG. 1D, in a form of the bottom pad 122a of a capacitor structure 120a and in locations of the second vertical contacts Vc2. In the 3D image sensor 100 of FIG. 1D, the bottom pad 122 of the capacitor structure 120 may have a rectangular structure extending in the second direction (y direction). On the other hand, in the 3D image sensor 100a of some embodiments, the bottom pad 122a may have a rectangular structure extending in the second direction (y direction), while including a step S on the outer portion of the bottom pad 122a. Due to the step S, the bottom pad 122a may have a shape similar to 'L'. Two bottom pads (122a-1 and 122a-2) may have a symmetrical structure with respect to a center point CP of the first rectangle Re1. For example, by forming the step S of the first bottom pad 122a-1 directed downward in the second direction (y direction) and the step S of the second bottom pad 122a-2 directed upward in the second direction (y direction), the step S of the first bottom pad 122a-1 and the step S of the second bottom pad 122a-2 may be symmetrical with respect to the center point CP of the first rectangle Re1.

The bottom pad 122a may have two widths in the first direction (x direction). In other words, the bottom pad 122a may have a second width W2 in a portion where the step S is not formed and may have a third width W3 less than the second width W2 in a portion where the step S is formed. The second width W2 of the bottom pad 122a may be greater than the first width W1 of the bottom pad 122 in the 3D image sensor 100 of FIG. 1D, and the third width W3 may be less than the first width W1. Accordingly, as illustrated in FIG. 3A, the vertical contact area Avca may be assigned to the outer portion of the first rectangle Re1 where the step S is formed, and the second vertical contacts Vc2 may be assigned to such vertical contact area Avca.

Referring to FIG. 3B, the 3D image sensor 100b of some embodiments may be different from the 3D image sensor 100 of FIG. 1D, in a form of the bottom pad 122b of a capacitor structure 120b and in locations of the second vertical contacts Vc2. In the 3D image sensor 100b of some embodiments, the bottom pad 122b may have a rectangular structure extending in the second direction (y direction), while having an outer concavity Cout outside of the central portion in the second direction (y direction). Due to the outer concavity Cout, the bottom pad 122b may have a shape similar to 'U'. On the other hand, a first bottom pad 122b-1 and a second bottom pad 122b-2 may have a symmetrical structure with respect to the center line CL of the first rectangle Re1. For example, the outer concavity Cout of the first bottom pad 122b-1 may be formed on the right outer side in the first direction (x direction), and the outer concavity Cout of the second bottom pad 122b-2 may be formed on the left outer side in the first direction (x direction), and thus, the outer concavities Cout of the first and second bottom pads 122b-1 and 122b-2 may be symmetrical to each other with respect to the center line CL of the first rectangle Re1.

The bottom pad 122b may have two widths in the first direction (x direction). In other words, the bottom pad 122b may have a second width W2' at both outer portions in the second direction (y direction) where the outer concave portion Cout is not formed and may have a third width W3' less than the second width W2' in the central portion in the second direction (y direction) where the outer concave portion Cout is formed. The second width W2' of the bottom pad 122b may be greater than the first width W1 of the bottom pad 122 in the 3D image sensor 100 of FIG. 1D, and the third width W3' may be less than the first width W1. Accordingly, as illustrated in FIG. 3B, a vertical contact area Avcb may be assigned to the outer portion of the first rectangle Re1 where the outer concavity Cout is formed, and the second vertical contacts Vc2 may be assigned to such vertical contact area Avcb.

The second width W2' and the third width W3' may be substantially equal to the second width W2 and the third width W3 of the bottom pad 122a in the 3D image sensor 100a of FIG. 3A, respectively. However, according to some embodiments, the second width W2' and the third width W3' may be different from the second width W2 and the third width W3, respectively.

Referring to FIG. 3C, the 3D image sensor 100c according to some embodiments may be different from the 3D image sensor 100 illustrated in FIG. 1D, in a form of a bottom pad 122c of a capacitor structure 120c and in locations of the second vertical contacts Vc2. In the 3D image sensor 100c of some embodiments, the bottom pad 122c may have a rectangular structure extending in the second direction (y direction), while having an inner concavity Cin inside the central portion in the second direction (y direction). Due to the inner concavity Cin, the bottom pad 122c may have a shape similar to 'U', like the bottom pad 122b of the 3D image sensor 100b of FIG. 3B. In the 3D image sensor 100c of some embodiments, when the bottom pad 122c is compared with the bottom pad 122b of the 3D image sensor 100b of FIG. 3B, there is a difference that the inner concavity Cin and the outer concavity Cout are arranged on opposite sides in the first direction (x direction). For example, the outer concavity Cout of the first bottom pad 122b-1 may be on the right side of the first bottom pad 122b-1, while the inner concavity Cin of the first bottom pad 122c-1 may be on the left side of the first bottom pad 122c-1.

The bottom pad 122c may have two widths in the first direction (x direction). In other words, the bottom pad 122c may have a second width W2" at both outer portions in the second direction (y direction) where the inner concavity Cin is not formed and may have a third width W3" less than the second width W2" in the central portion in the second direction (y direction) where the inner concavity Cin is formed. The second width W2" of the bottom pad 122c may be greater than the first width W1 of the bottom pad 122 in the 3D image sensor 100 of FIG. 1D, and the third width W3" may be less than the first width W1. Accordingly, as illustrated in FIG. 3C, a vertical contact area Avcc may be assigned to the central portion of the first rectangle Re1 where the inner concavity Cin is formed, and the second vertical contacts Vc2 may be assigned to such vertical contact area Avcc.

The second width W2" and the third width W3" may be substantially equal to the second width W2 and the third width W3 of the bottom pad 122a in the 3D image sensor 100a of FIG. 3A, respectively. However, according to an embodiment, the second width W2" and the third width W3" may be different from the second width W2 and the third width W3, respectively.

Figure 4A:
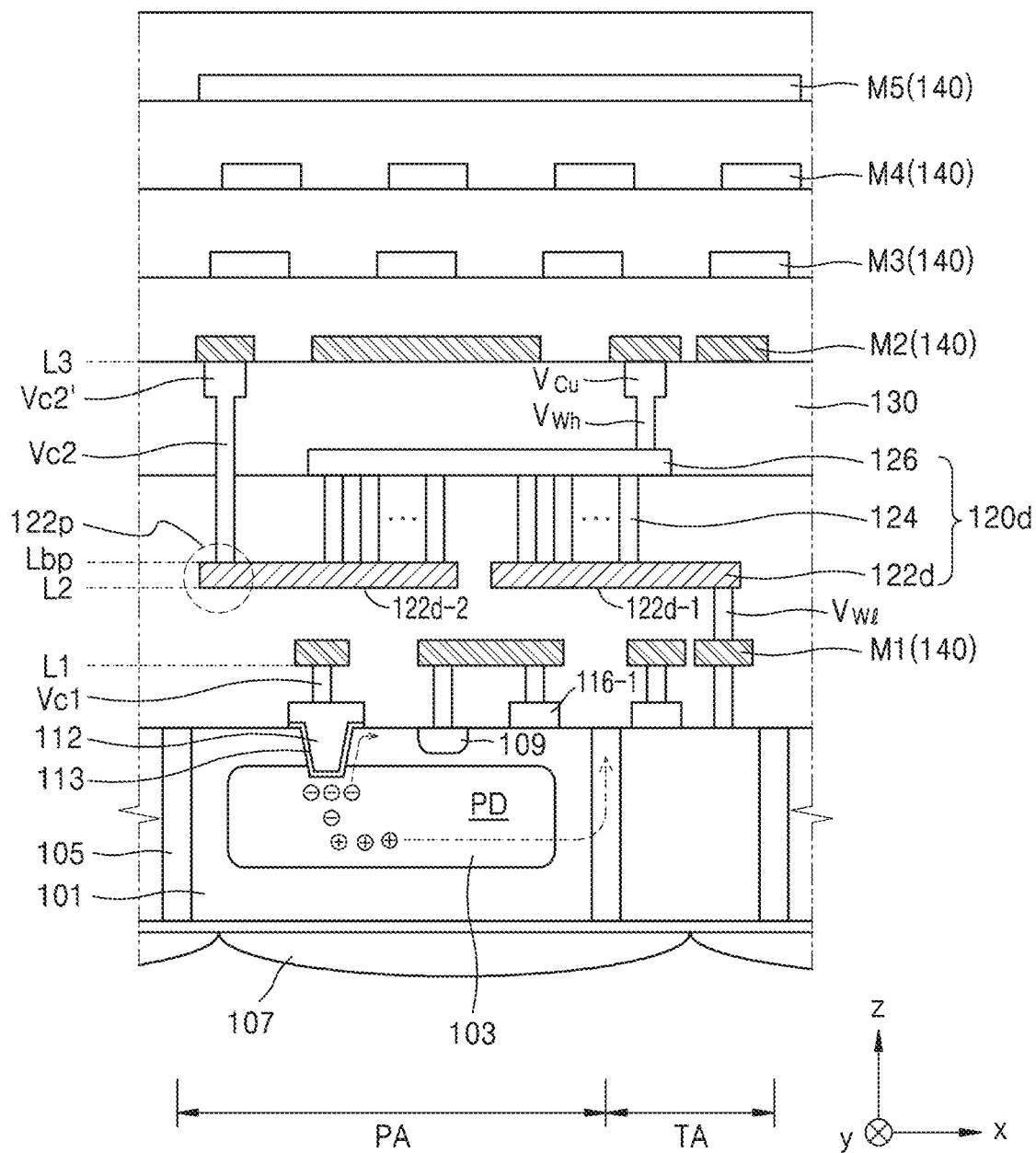
FIG. 4A is a cross-sectional view of a 3D image sensor based on the SL according to some embodiments.
Figure 4B:
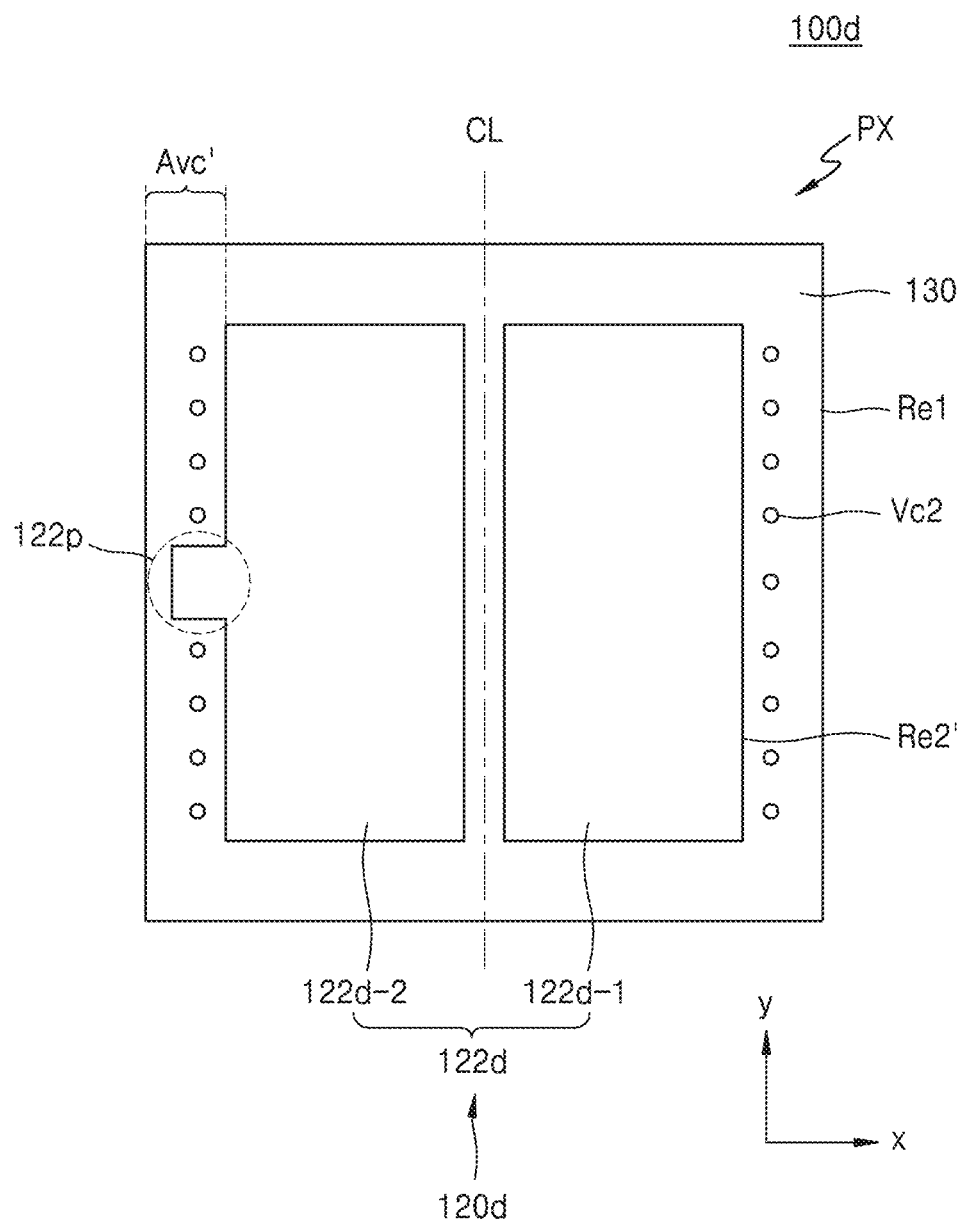
FIG. 4B is a plan view on a level of a top surface of a bottom pad of the 3D image sensor of FIG. 4A.

FIG. 4A is a cross-sectional view of a 3D image sensor 100d based on the SL according to some embodiments, and FIG. 4B is a plan view at a level of a top surface of a bottom pad 122d of the 3D image sensor 100d of FIG. 4A. The descriptions already given with reference to FIGS. 1A through 3C are briefly provided or omitted.

Referring to FIGS. 4A and 4B, the 3D image sensor 100d of some embodiments may be different from the 3D image sensor 100 of FIG. 1A in a form of a capacitor structure 120d. In the 3D image sensor 100d of some embodiments, a second bottom pad 122d-2 of a bottom pad 122d may include a protrusion 122p that protrudes toward a left outer boundary in the first direction (x direction), and the protrusion 122p may be connected to a corresponding pad of the second wiring layer M2 via the second vertical contact Vc2 and the additional second contact Vc2'.

In the 3D image sensor 100d of some embodiments also, the capacitor structure 120d may be between the first wiring layer M1 and the second wiring layer M2. Thus, a process of forming the pads of the second wiring layer M2 and the bottom pad 122d may be easier, the short failure possibility may be reduced, and/or an area of the bottom pad 122d may be easily secured even when the size of the pixel is reduced in the future. In addition, as illustrated in FIG. 4B, the second vertical contacts Vc2 may be arranged in the second direction (y direction) at positions corresponding to the protrusion 122p of the bottom pad 122d, and the second vertical contacts Vc2 may be connected to the semiconductor substrate 101 or the gates on the semiconductor substrate 101 via corresponding pads of the first wiring layer M1. The corresponding pads of the first wiring layer M1 corresponding to the gates are below the bottom pad 122d, and thus are not illustrated in FIG. 4B.

In the 3D image sensor 100d of some embodiments, by including the protrusion 122p, a vertical contact area Avc' may be sufficiently secured. In addition, since the vertical contact area Avc' is sufficiently secured, even when the pixel size is reduced in the future, a sufficient area for the bottom pad 122d may be secured.

Figure 5A:
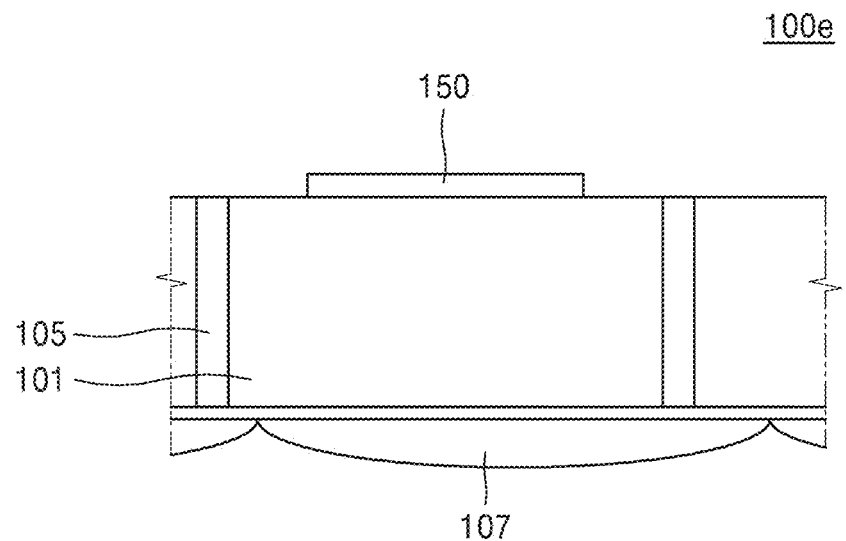
FIGS. 5A and 5B are cross-sectional views of 3D image sensors based on the SL according to some embodiments, respectively.
Figure 5B:
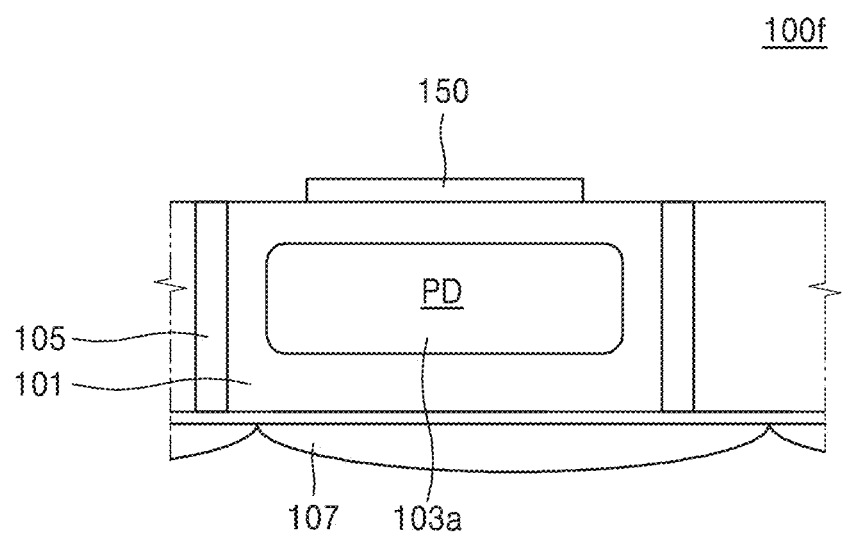

FIGS. 5A and 5B are cross-sectional views of 3D image sensors 100e and 100f based on the SL according to some embodiments, respectively, wherein only a charge generation area in the semiconductor substrate 101 is illustrated while a capacitor structure, an interlayer insulation layer, and a multiple wiring layer, etc., which are over the semiconductor substrate 101, are omitted. The descriptions already given with reference to FIGS. 1 through 4B are briefly provided or omitted.

Referring to FIG. 5A, in the 3D image sensor 100e of some embodiments, a separate PD may not be formed in the semiconductor substrate 101. Instead of the PD, a photogate 150 may be on the semiconductor substrate 101. When a high voltage is applied to the photogate 150, a field may be formed in the semiconductor substrate 101, light incident through the bottom surface of the semiconductor substrate 101 may be converted into an electron-hole pair near the field, and thus charges may be generated.

The photogate 150 may generate the charges and at the same time may perform a function as a transfer gate. Accordingly, a separate transfer gate may not be formed. However, according to some embodiments, a separate transfer gate may be around the photogate 150, together with the photogate 150.

In the 3D image sensor 100e of some embodiments, a capacitor structure (refer to 120 in FIG. 1A) may be over the semiconductor substrate 101, and the capacitor structure 120 may be between a first wiring layer (refer to M1 in FIG. 1A) and a second wiring layer (refer to M2 in FIG. 1A). In other words, a bottom pad (refer to 122 in FIG. 1A) of the capacitor structure 120 may be separately formed at a level different from that of the second wiring layer M2. Accordingly, the 3D image sensor 100e of some embodiments may also have the effect as described for the 3D image sensor 100 of FIG. 1A.

Referring to FIG. 5B, the 3D image sensor 100f of some embodiments may be different from the 3D image sensor 100e of FIG. 5A, in that a PD 103a is additionally arranged in the semiconductor substrate 101. In the 3D image sensor 100f of the present embodiment, the PD 103a may be additionally formed beneath the photogate 150, and thus, a deeper field may be formed. Thus, the 3D image sensor 100f of the present embodiment may generate more charges by using a combined structure of the photogate 150 and the PD 103a.

In the 3D image sensor 100f of some embodiments, the capacitor structure (refer to 120 in FIG. 1A) may be over the semiconductor substrate 101, and the capacitor structure 120 may be between a first wiring layer (refer to M1 in FIG. 1A) and a second wiring layer (refer to M2 in FIG. 1A). Accordingly, the 3D image sensor 100f of some embodiments may also have the effect as described for the 3D image sensor 100 of FIG. 1A.

Even though structural and functional characteristics of a capacitor structure have been described mainly with respect to a 3D image sensor based on the SL, the structural and functional characteristics of the capacitor structure are not limited thereto. For example, the structural and functional characteristics of the capacitor structure may also be applied to other types of 3D image sensors, such as a 3D image sensor based on time of flight. In addition, the structural and functional characteristics of the capacitor structure may also be applied to a conventional 2D image sensor.

Figure 6:
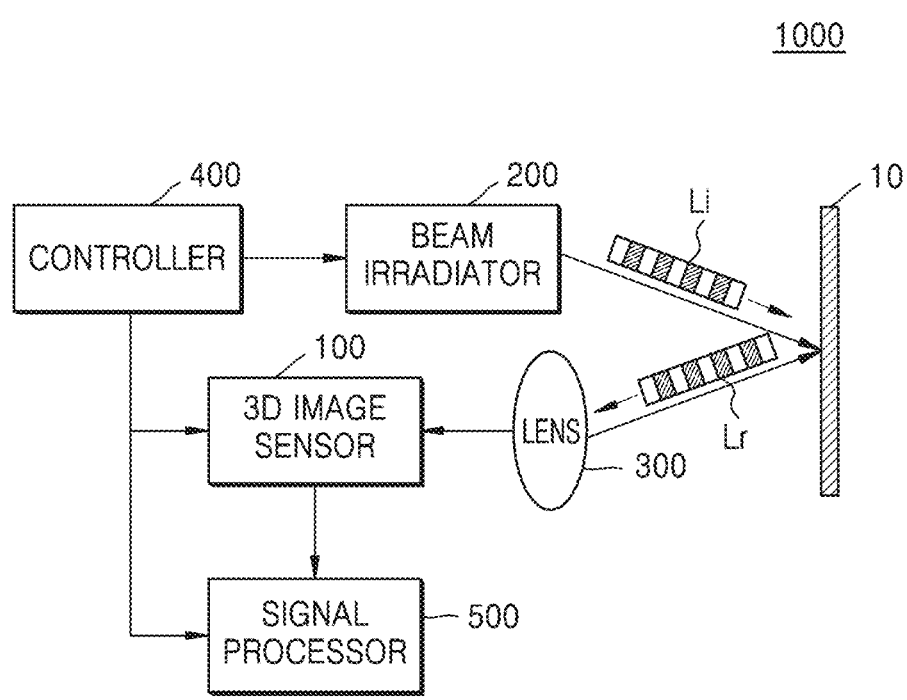
FIG. 6 is a schematic configuration diagram of an electronic device including a 3D image sensor according to some embodiments.

FIG. 6 is a schematic configuration diagram of an electronic device 1000 including the 3D image sensor 100 according to some embodiments. The descriptions already given with reference to FIGS. 1A through 5B are briefly provided or omitted.

Referring to FIG. 6, the electronic device 1000 of some embodiments may include the 3D image sensor 100, a light irradiator 200, a lens 300, a controller 400, and/or a signal processor 500. The 3D image sensor 100 may be, for example, the 3D image sensor 100 of FIG. 1A. However, the 3D image sensor 100 is not limited thereto, and the 3D image sensors 100a through 100f of FIGS. 3A through 3C, FIGS. 4A, 5A, and 5B may be employed in the electronic device 1000 of some embodiments.

The light irradiator 200 may generate light and irradiate the light to an object 10. The light irradiator 200 may generate infra-red light and irradiate the infrared light to the object 10. However, embodiments are not limited thereto. The light irradiator 200 may generate near infra-red (NIR), ultraviolet (UV), visible light, etc., and may irradiate them to the object 10. The light irradiator 200 may be implemented by a light emitting diode (LED) array, a light amplification by the stimulated emission of radiation (LASER) device, etc. As described above, the light irradiator 200 may generate structured light L1 and irradiate the structured light L1 to the object 10. On the other hand, in FIG. 6, even though a 1D SL is illustrated, a 2D SL may be generated and irradiated.

The lens 300 may condense structured light Lr reflected from the object 10 and transmit the condensed structured light to the 3D image sensor 100. The controller 400 may generally control the 3D image sensor 100, the light irradiator 200, and the signal processor 500. The signal processor 500 may generate a depth image, that is, a 3D image, of the object 10 by using a signal processing module based on an amount of charges that is measured according to an SL method in the 3D image sensor 100.

The controller 400 and/or signal processor 500 may include processing circuitry including, but not limited to, a processor, Central Processing Unit (CPU), a controller, an arithmetic logic unit (ALU), a digital signal processor, a microcomputer, a field programmable gate array (FPGA), a System-on-Chip (SoC), a programmable logic unit, a microprocessor, or any other device capable of responding to and executing instructions in a defined manner. In some example embodiments, the controller 400 and/or signal processor 500 may be at least one of an application-specific integrated circuit (ASIC) and/or an ASIC chip.

The controller 400 and/or signal processor 500 may be configured as a special purpose machine by executing computer-readable program code stored on a storage device. The program code may include program or computer-readable instructions, software elements, software modules, data files, data structures, and/or the like, capable of being implemented by one or more hardware devices, such as one or more instances of the controller 400 and/or signal processor 500 mentioned above. Examples of program code include both machine code produced by a compiler and higher level program code that is executed using an interpreter.

The controller 400 and/or signal processor 500 may include one or more storage devices. The one or more storage devices may be tangible or non-transitory computer-readable storage media, such as random access memory (RAM), read only memory (ROM), a permanent mass storage device (such as a disk drive), solid state (e.g., NAND flash) device, and/or any other like data storage mechanism capable of storing and recording data. The one or more storage devices may be configured to store computer programs, program code, instructions, or some combination thereof, for one or more operating systems and/or for implementing the example embodiments described herein. The computer programs, program code, instructions, or some combination thereof, may also be loaded from a separate computer readable storage medium into the one or more storage devices and/or one or more computer processing devices using a drive mechanism or capable of transmitting data. Such separate computer readable storage medium may include a USB flash drive, a memory stick, a Blu-ray/DVD/CD-ROM drive, a memory card, and/or other like computer readable storage media. The computer programs, program code, instructions, or some combination thereof, may be loaded into the one or more storage devices and/or the one or more computer processing devices from a remote data storage device via a network interface, rather than via a local computer readable storage medium. Additionally, the computer programs, program code, instructions, or some combination thereof, may be loaded into the one or more storage devices and/or the one or more processors from a remote computing system that is configured to transfer and/or distribute the computer programs, program code, instructions, or some combination thereof, over a network.

A 3D image sensor based on the SL according to the technical idea of the inventive concepts may include a capacitor structure for storing charges generated in a PD, and a bottom pad of the capacitor structure may be at a second level between a first level of a first wiring layer and a third level of a second wiring layer in a vertical direction over a semiconductor substrate. Since the bottom pad is between the first level of the first wiring layer and the third level of the second wiring layer, forming of pads of the second wiring layer and the bottom pad may be easier, and a short failure between the pads of the second wiring layer and the bottom pad may be reduced. In addition, when a pixel size is decreased in the future, an area of the bottom pad may be sufficiently secured.

While the inventive concepts have been particularly shown and described with reference to embodiments thereof, it will be understood that various changes in form and details may be made therein without departing from the spirit and scope of the following claims.

What is claimed is:

1. An image sensor, the image sensor comprising:
a pixel area comprising a photodiode in a semiconductor substrate;
a multiple wiring layer over the semiconductor substrate, the multiple wiring layer comprising a first wiring layer and a second wiring layer on the first wiring layer; and
a capacitor structure between the first wiring layer and the second wiring layer, the capacitor structure comprising a bottom pad layer, a top pad, and a plurality of capacitors between the bottom pad layer and the top pad,
wherein the bottom pad layer is connected to the first wiring layer, and
wherein the bottom pad layer includes a first bottom pad and a second bottom pad horizontally spaced apart from each other.

2. The image sensor of claim 1, wherein no wirings, of the multiple wiring layer, are at a level where the bottom pad layer is arranged.

3. The image sensor of claim 1, wherein
the first wiring layer is a lowermost wiring layer of the multiple wiring layer, and the second wiring layer is a wiring layer directly above the first wiring layer.

4. The image sensor of claim 1, wherein
the first and second bottom pads are symmetric with respect to each other, and
no wirings, of the multiple wiring layer, are at a level where the first and second bottom pads are arranged.

5. The image sensor of claim 1, wherein
the pixel area has a first rectangular shape, and the first and second bottom pads are formed on the pixel area.

6. The image sensor of claim 5, wherein
the first and second bottom pads are apart from each other such that the first and second bottom pads form a second rectangle shape.

7. The image sensor of claim 6, wherein
the second rectangle shape comprises a concavity portion or a step portion.

8. The image sensor of claim 1, wherein each of the plurality of capacitors has a cylindrical structure.

9. The image sensor of claim 8, wherein the bottom pad layer comprises tungsten (W), and the top pad comprises silicon germanium (SiGe).

10. The image sensor of claim 8, wherein the top pad is below the second wiring layer, and is connected to the second wiring layer via a top vertical contact.

11. The image sensor of claim 1, wherein the pixel area comprises a gate group on a top portion of the semiconductor substrate, and
a transfer gate of the gate group is formed in a recess in the semiconductor substrate.

12. An image sensor, the image sensor comprising:
a charge generation area at a central portion of a pixel on a semiconductor substrate;
a gate group configured to transmit charges generated in the charge generation area;
a multiple wiring layer comprising at least two wiring layers on the pixel; and
a capacitor structure between two adjacent wiring layers of the multiple wiring layer, the capacitor structure comprising a bottom pad layer, a top pad, and a plurality of capacitors between the bottom pad layer and the top pad,
wherein no wirings, of the multiple wiring layer, are at a level where the bottom pad layer is arranged, and
wherein the bottom pad layer includes a first bottom pad and a second bottom pad horizontally spaced apart from each other.

13. The image sensor of claim 12, wherein the capacitor structure is between a first wiring layer and a second wiring layer of the two adjacent wiring layers, the first wiring layer is a lowermost wiring layer of the multiple wiring layer, and the bottom pad layer is electrically connected to the semiconductor substrate via the first wiring layer.

14. The image sensor of claim 12, wherein the charge generation area comprises one of a photodiode structure, a photogate structure, and a combination thereof.

15. The image sensor of claim 12, wherein
the gate group comprising a plurality of gates, and
a transfer gate of the gate group is formed in a recess in the semiconductor substrate.

16. An image sensor, the image sensor comprising:
a pixel area comprising a photodiode in a semiconductor substrate;
a multiple wiring layer on an upper portion of the pixel area, the multiple wiring layer comprising a first wiring layer and a second wiring layer on the first wiring layer; and
a capacitor structure between the first wiring layer and the second wiring layer, the capacitor structure comprising a bottom pad layer, a top pad, and a plurality of capacitors between the bottom pad layer and the top pad,
wherein the bottom pad layer includes a first bottom pad and a second bottom pad,
wherein, the first and second bottom pads are horizontally apart from each other, and
the bottom pad layer is connected to the first wiring layer.

17. The image sensor of claim 16, wherein
the pixel area comprises a gate group on a top portion of the photodiode, and
a transfer gate of the gate group is on the photodiode, and formed in a recess in the semiconductor substrate.

18. The image sensor of claim 16, wherein
the bottom pad layer is electrically connected to a source area or a drain area via the first wiring layer and a vertical contact.

19. The image sensor of claim 16, wherein
the pixel area has a first rectangular shape, and
the first and second bottom pads are formed on the pixel area, and are apart from each other such that the first and second bottom pads form a second rectangle shape.

20. The image sensor of claim 19, wherein
the second rectangle shape comprises a concavity portion or a step portion.

* * * * *